(12) United States Patent
Taillet et al.

(10) Patent No.: US 10,614,879 B2
(45) Date of Patent: Apr. 7, 2020

(54) EXTENDED WRITE MODES FOR NON-VOLATILE STATIC RANDOM ACCESS MEMORY ARCHITECTURES HAVING WORD LEVEL SWITCHES

(71) Applicant: STMicroelectronics (Rousset) SAS, Rousset (FR)

(72) Inventors: Francois Taillet, Fuveau (FR); Marc Battista, Allauch (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/043,497

(22) Filed: Jul. 24, 2018

(65) Prior Publication Data

US 2020/0035293 A1    Jan. 30, 2020

(51) Int. Cl.
| | | |
|---|---|---|
| *G11C 8/00* | (2006.01) | |
| *G11C 11/419* | (2006.01) | |
| *G11C 11/4096* | (2006.01) | |
| *G11C 7/22* | (2006.01) | |
| *G11C 8/12* | (2006.01) | |
| *G11C 11/418* | (2006.01) | |

(52) U.S. Cl.
CPC .............. *G11C 11/419* (2013.01); *G11C 7/22* (2013.01); *G11C 8/12* (2013.01); *G11C 11/4096* (2013.01); *G11C 11/418* (2013.01)

(58) Field of Classification Search
CPC . G11C 11/419; G11C 11/4096; G11C 11/418; G11C 7/22; G11C 8/12
USPC ................ 365/230.03, 230.05, 154, 189.011
See application file for complete search history.

(56) References Cited

U.S. PATENT DOCUMENTS

| | | | |
|---|---|---|---|
| 6,414,873 B1 * | 7/2002 | Herdt ............... | G11C 14/00 365/154 |
| 6,556,487 B1 | 4/2003 | Ratnakumar et al. | |
| 9,099,164 B2 | 8/2015 | Erickson et al. | |
| 9,502,110 B1 | 11/2016 | Taillet | |
| 9,779,814 B2 | 10/2017 | Wang | |
| 2002/0163832 A1 | 11/2002 | Bertrand et al. | |
| 2006/0023503 A1 * | 2/2006 | Lee ................... | G11C 14/00 365/185.05 |
| 2008/0043516 A1 * | 2/2008 | Dalton .............. | G11C 14/00 365/154 |
| 2008/0101125 A1 | 5/2008 | Conte et al. | |
| 2009/0190402 A1 * | 7/2009 | Hsu ................... | G11C 14/00 365/185.08 |

(Continued)

*Primary Examiner* — Connie C Yoha
(74) *Attorney, Agent, or Firm* — Crowe & Dunlevy

(57) ABSTRACT

Disclosed herein is a method of performing a non-volatile write to a memory containing a plurality of volatile memory cells grouped into words, with each volatile memory cell having at least one non-volatile memory cell associated therewith. The method includes steps of a) receiving a non-volatile write instruction including at least one address and at least one data word to be written to that at least one address, b) writing the at least one data word to the volatile memory cells of a word at the at least one address, and c) writing data from the volatile memory cells written to during step b) to the non-volatile memory cells associated to those volatile memory cells by individually addressing those non-volatile memory cells for non-volatile writing, but not writing data from other volatile memory cells to their associated non-volatile memory cells because those non-volatile memory cells are not addressed.

17 Claims, 10 Drawing Sheets

(56) References Cited

U.S. PATENT DOCUMENTS

| | | |
|---|---|---|
| 2011/0261620 A1 | 10/2011 | Shih et al. |
| 2014/0369119 A1 | 12/2014 | Tailliet et al. |
| 2015/0269989 A1 | 9/2015 | Tailliet et al. |
| 2015/0371708 A1 | 12/2015 | Pickering |
| 2016/0111159 A1 | 4/2016 | Tandingan et al. |
| 2017/0345505 A1 | 11/2017 | Noel et al. |
| 2018/0166139 A1 | 6/2018 | Hsu |

\* cited by examiner

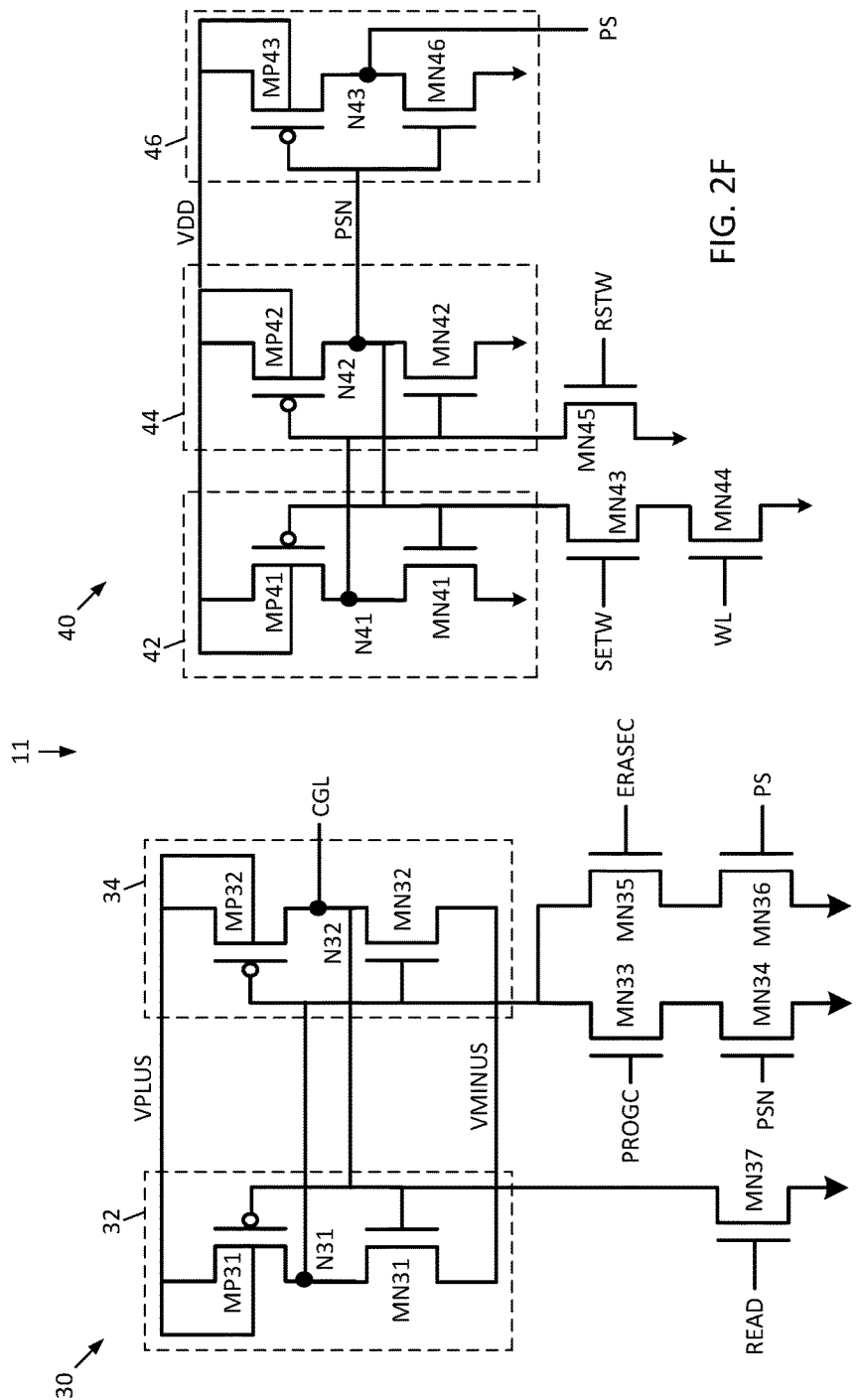
FIG. 2F
FIG. 2E
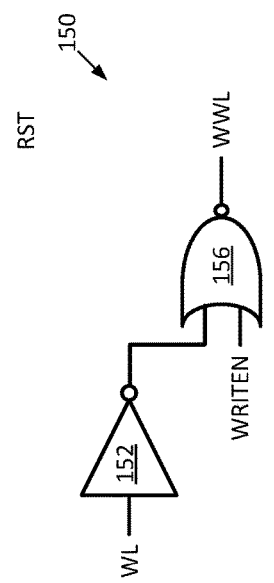
FIG. 2G

EXTENDED WRITE MODES FOR NON-VOLATILE STATIC RANDOM ACCESS MEMORY ARCHITECTURES HAVING WORD LEVEL SWITCHES

TECHNICAL FIELD

This disclosure is directed to the field of non-volatile static random access memory (NVSRAM) architectures that have word level switches permitting non-volatile write (store) operations on individual words, and in particular, extended non-volatile write modes for such NVSRAM architectures.

BACKGROUND

There are two main types of memory devices used in computers today, namely "non-volatile" and "volatile" memory devices. The name "non-volatile" comes from the fact that non-volatile memory devices maintain the data stored therein, even when power is removed or temporarily lost. It follows that the name "volatile" comes from the fact that volatile memory devices do not maintain the data stored therein when the power is removed or temporarily lost.

Common non-volatile memory devices include read only memory (ROM) devices, EPROM (erasable programmable ROM) devices, EEPROM (electrically erasable programmable ROM) devices, and flash RAM devices. Common volatile memory devices include dynamic random access memory (DRAM) and static random access memory (SRAM) devices. Volatile memory devices are widely used for temporary data storage, such as during data manipulation, since writing data into or reading data out of these devices can be performed quickly and easily. However, a disadvantage of these volatile memory devices is that they require the constant application of power, and in the case of DRAM a data refresh signal, to maintain data stored in the memory cells. Once power supplied to the device is interrupted, the data stored in the volatile memory cells is lost.

Non-volatile memory devices suffer from an endurance problem caused by repeated cycling of program and erase operations, as well as slower access speeds than volatile memory devices. SRAM devices have a fast data access speed and a long lifetime, and are therefore suitable for use in a computer system. However, since SRAM is a volatile memory device, the stored data stored will be lost if power is interrupted. Therefore, there was a recognized need to back up information stored in SRAM memories with non-volatile memory, in the event of power failure.

Consequently, non-volatile static random access memory (NVSRAM) has been developed, which pairs each SRAM cell with two EEPROM cells so as to produce a device capable of quickly storing the contents of the SRAM cell in the event of power loss and then retrieving of those contents when power is restored. Each EEPROM cell is comprised of a floating gate transistor that has a charge placed on its floating gate to modify the voltage threshold VT of that floating gate transistor, and this charge indicates the state of the binary data retained in that EEPROM cell.

Both EEPROM and NVSRAM memories suffer notable drawbacks. With EEPROM, while the minimal granularity of a store operation is one byte, the maximal granularity of a store operation is one page, which is one row—this means that only a single word line may be written to at once. Therefore, to store more than a row's worth of data into an EEPROM, a store must be performed sequentially on each row until the data to be written is complete. Since a store operation on an EEPROM may only store data to a single same page (row), storing a quantity of data in excess of one page (row) to an EEPROM requires multiple such operations, is time consuming, and consumes excessive power.

One advantage of NVSRAM is that it can store the contents of all of its SRAM cells to their respective EEPROM cells in parallel, making store operations of large amounts of data a quick operation. However, this is also a considerable drawback in that a conventional NVSRAM is only arranged to store the contents of all of its SRAM cells to their respective EEPROM cells in parallel, and if a store to fewer than all EEPROM cells is desired, it cannot be performed. The reasons for this are shown in FIG. 1, which it can be seen that every NVSRAM cell 10 receives the same power source line PS and same control gate line CGL, both of which are manipulated when performing store operations to the EEPROM cells. In addition, each row of NVSRAM cells 10 receives a respective wordline WL for that row.

Since it is desirable not only for there to be NVSRAM cells capable of performing a store operation on less than all of their EEPROM cells, but for such capability to have opcodes supporting the operations it makes possible, further development of NVSRAm technology is needed.

SUMMARY

Disclosed herein is a method of performing a non-volatile write to a memory containing a plurality of volatile memory cells grouped into words, with each volatile memory cell having at least one non-volatile memory cell associated therewith. The method includes steps of: a) receiving a non-volatile write instruction, the non-volatile write instruction including at least one address and at least one data word to be written to that at least one address; b) writing the at least one data word to the volatile memory cells of a word at the at least one address; and c) at specified time, writing data from the volatile memory cells written to during step b) to the non-volatile memory cells associated to those volatile memory cells by individually addressing those non-volatile memory cells for non-volatile writing, but not writing data from other volatile memory cells to their associated non-volatile memory cells because those non-volatile memory cells are not addressed.

The specified time may or may not be when chip deselection of the memory occurs.

The at least one address may include a starting address. The at least one data word may be a plurality of data words. Step b) may include: b1) writing a first data word of the plurality of data words to the volatile memory cells of the word at the starting address; b2) incrementing the starting address to produce a next address; b3) writing a next data word of the plurality of data words to the volatile memory cells of the word at the next address; b4) if the plurality of data words contains another data word that was not yet written, increment the next address and returning to step b3); and b5) if the plurality of data words does not contain another data word that was not yet written, proceeding to step c).

The specified time may or may not be when chip deselection of the memory occurs.

The at least one address may be a plurality of addresses. The at least one data word may be a plurality of data words. Step b) may include: b1) writing a first data word of the plurality of data words to the volatile memory cells of a word at a first of the plurality of addresses; b2) writing a next data word of the plurality of data words to the volatile memory cells of a word at a next of the plurality of addresses; b3) if the next of the plurality of addresses is a last address of the plurality of addresses, proceeding to step c); and b4) if the next of the plurality of addresses is not a last address of the plurality of addresses, returning to step b2).

The specified time may or may not be when chip deselection of the memory occurs.

Also disclosed herein is an electronic device including a memory array comprising a plurality of volatile memory cells grouped into words and at least one non-volatile memory cell associated with each volatile memory cell, and a plurality of word level switches, each word level switch being associated with one word and permitting writing of data to non-volatile memory cells associated with volatile memory cells of that word. The electronic device may also include control circuitry configured to perform steps of: a) receiving a non-volatile write instruction, the non-volatile write instruction including at least one address and at least one data word to be written to that at least one address; b) writing the at least one data word to the volatile memory cells of a word at the at least one address; and c) at specified time, writing data from the volatile memory cells written to during step b) to the non-volatile memory cells associated to those volatile memory cells by individually addressing those non-volatile memory cells for non-volatile writing, but not writing data from other volatile memory cells to their associated non-volatile memory cells because those non-volatile memory cells are not addressed.

The specified time may or may not be when chip deselection of the memory array occurs.

The at least one address may be a plurality of addresses. The at least one data word may be a plurality of data words. Step b) may include: b1) writing a first data word of the plurality of data words to the volatile memory cells of a word at a first of the plurality of addresses; b2) writing a next data word of the plurality of data words to the volatile memory cells of a word at a next of the plurality of addresses; b3) if the next of the plurality of addresses is a last address of the plurality of addresses, proceeding to step c); and b4) if the next of the plurality of addresses is not a last address of the plurality of addresses, returning to step b2).

The specified time may or may not be when chip deselection of the memory occurs.

Also disclosed herein is a method of operating a non-volatile static random access memory (NVSRAM) including: a) receiving a non-volatile write instruction, the non-volatile write instruction including at least one address and at least one data word to be written to that at least one address; b) writing the at least one data word to volatile memory cells of a word at the at least one address; and c) writing data from the volatile memory cells written to during step b) to the non-volatile memory cells associated to those volatile memory cells by individually addressing those non-volatile memory cells for non-volatile writing.

The at least one address may include a starting address. The at least one data word may include a plurality of data words. Step b) may include: b1) writing a first data word of the plurality of data words to the volatile memory cells of the word at the starting address; b2) incrementing the starting address to produce a next address; b3) writing a next data word of the plurality of data words to the volatile memory cells of the word at the next address; b4) if the plurality of data words contains another data word that was not yet written, increment the next address and returning to step b3); and b5) if the plurality of data words does not contain another data word that was not yet written, proceeding to step c).

The at least one address may be a plurality of addresses. The at least one data word may be a plurality of data words. Step b) may include: b1) writing a first data word of the plurality of data words to the volatile memory cells of a word at a first of the plurality of addresses; b2) writing a next data word of the plurality of data words to the volatile memory cells of a word at a next of the plurality of addresses; b3) if the next of the plurality of addresses is a last address of the plurality of addresses, proceeding to step c); and b4) if the next of the plurality of addresses is not a last address of the plurality of addresses, returning to step b2).

BRIEF DESCRIPTION OF THE DRAWINGS

FIG. 2E is a schematic diagram of a control gate latch within word switch circuitry for use with the NVSRAM cell of FIG. 2D.

FIG. 2F is a schematic diagram of a power source latch within the word switch circuitry for use with the NVSRAM cell of FIG. 2D.

FIG. 2G is a schematic diagram of control logic within the word switch circuitry for use with the NVSRAM cell of FIG. 2D.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
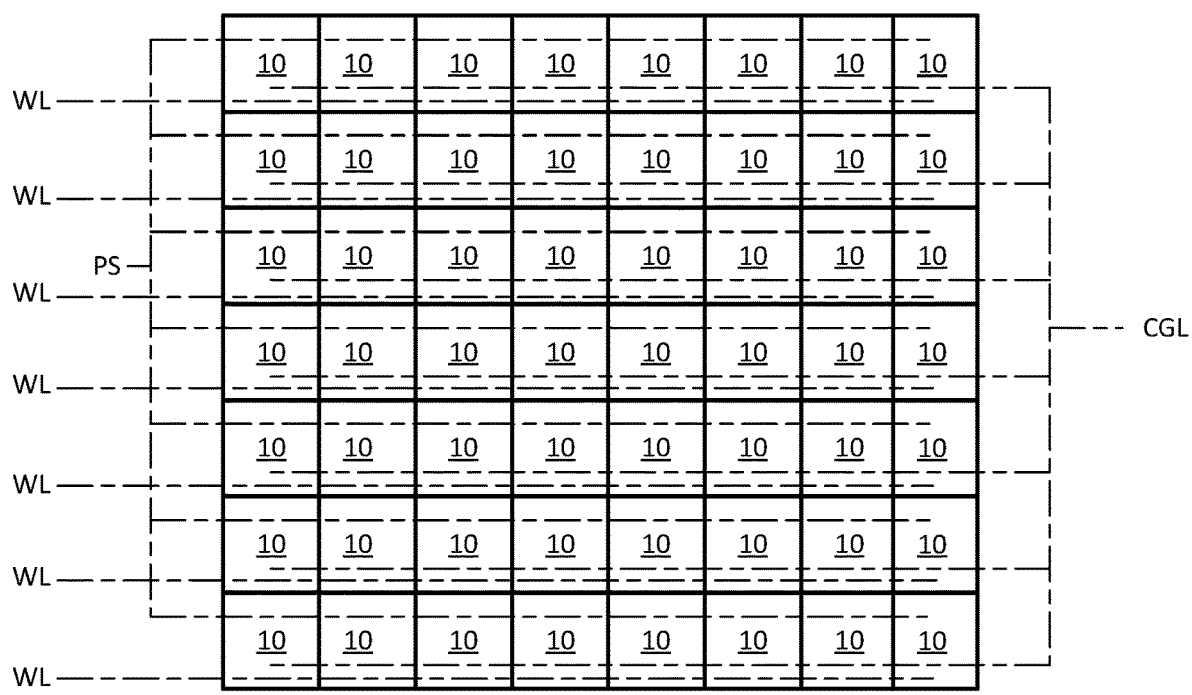
FIG. 1 is a block diagram of a prior art NVSRAM array utilizing prior art NVSRAM cells and prior art control techniques.
Figure 2A:
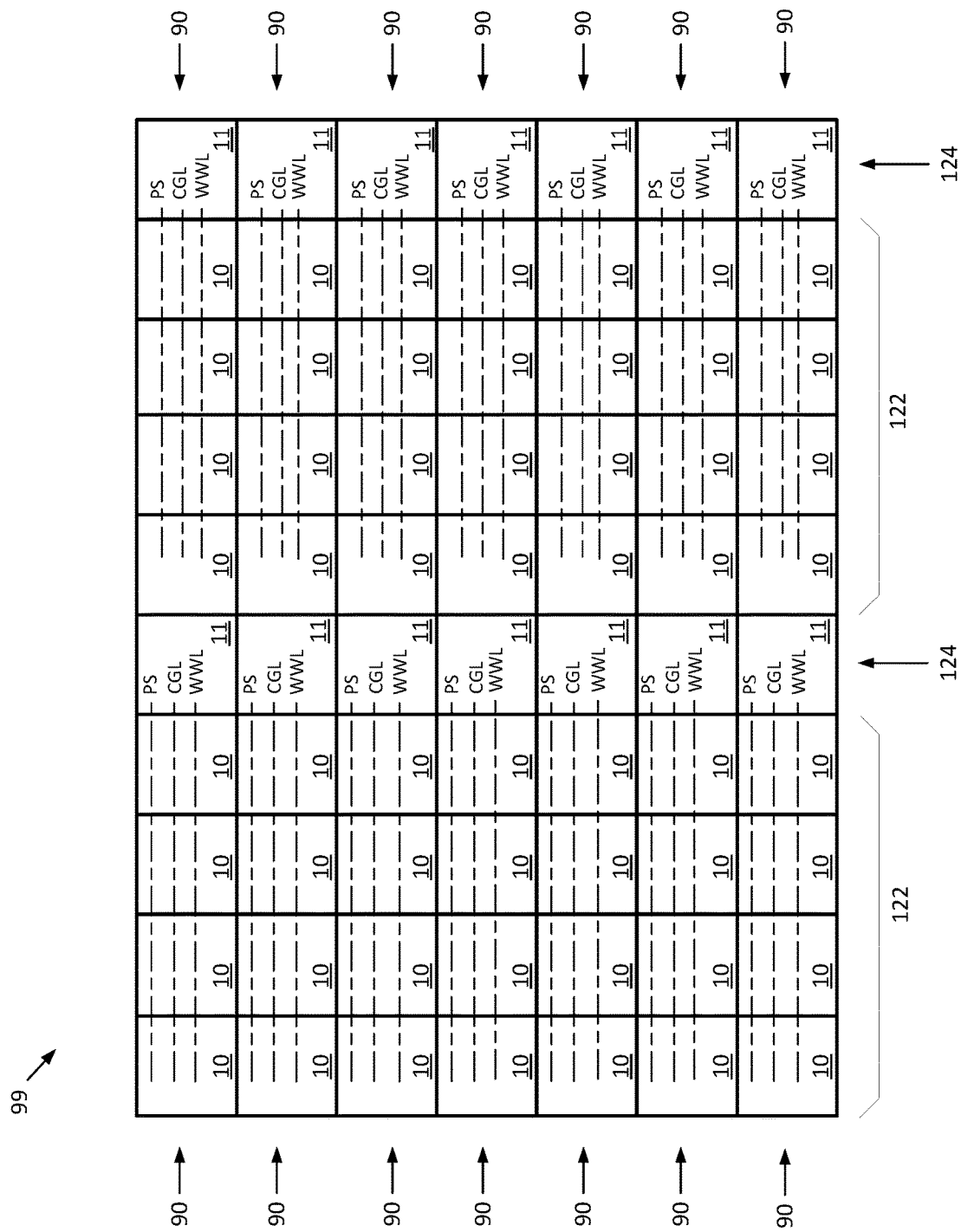
FIG. 2A is a block diagram of a NVSRAM array disclosed herein having word level switches enabling non-volatile write operations to be performed on a word by word basis.

Reference is first made to FIG. 2A, showing a NVSRAM array 99 comprised of multiple NVSRAM cells 10 and word level switches 11, with the NVSRAM cells 10 being arranged into words 90, and with one word level switch 11 located adjacent each word 90. The words 90 are arranged into columns 122, and the word level switches 11 are arranged into columns 124 as well. The word level switches 11 generate individual word level control signals, such as a power signal on a power source line PS, a control gate signal on a control gate line CGL, and a word level word signal on a word level word line WWL.

Understand that it is these word level switches 11 that permit each word of the NVSRAM array 99 to be individually addressed during non-volatile operations, yet be backward compatible with standard NVSRAM volatile and non-volatile operations if desired.

Figure 2B:
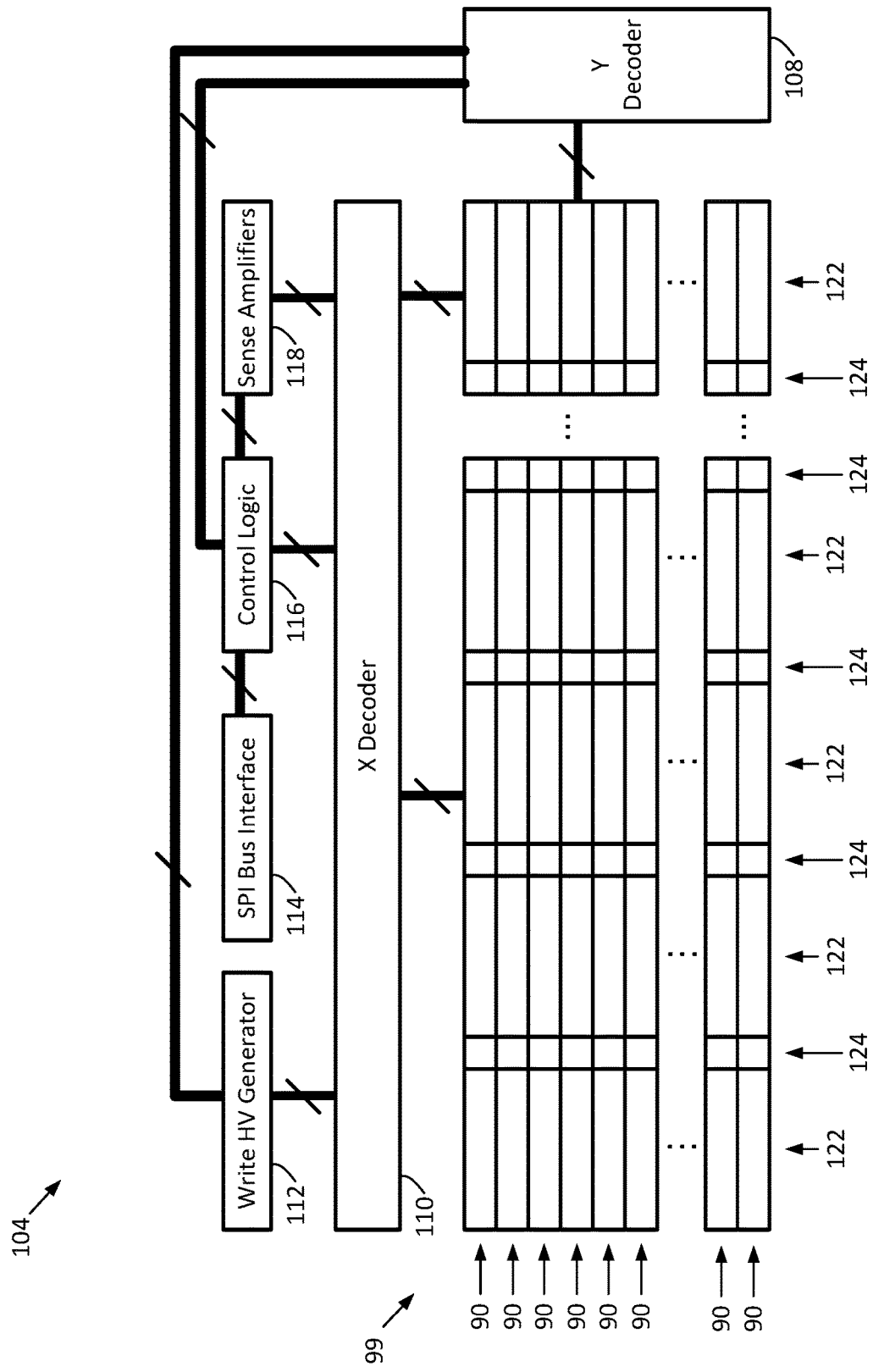
FIG. 2B is a block diagram of a NVSRAM memory disclosed herein utilizing the NVSRAM array of FIG. 2A.

A NVSRAM memory 104 is further described with additional reference to FIG. 2B. The NVSRAM memory 104 includes the NVSRAM array 99, which itself includes multiple columns 122, with each column being comprised of words 90 of NVSRAM cells 10. Each word 90 is divided into its constituent NVSRAM cells 10. Adjacent each column 122 of NVSRAM words 90 is a column 124 of word level switches 11. A row decoder 108 and column decoder 110 receive instructions from control logic 116 and decode addresses within the NVSRAM array 99 accordingly. A write HV generator 112 and sense amplifiers 118 respectively operate during write and read cycles to effectuate writes of data to, and reads of data from, the NVSRAM array 99. The control logic 116 may receive commands or opcodes (e.g. read, write, reload, store, extended page write, bulk write, and delayed write) via a SPI bus interface 114, and may generate its commands to the row decoder 108 and column decoder 110 based thereupon.

Figure 2C:
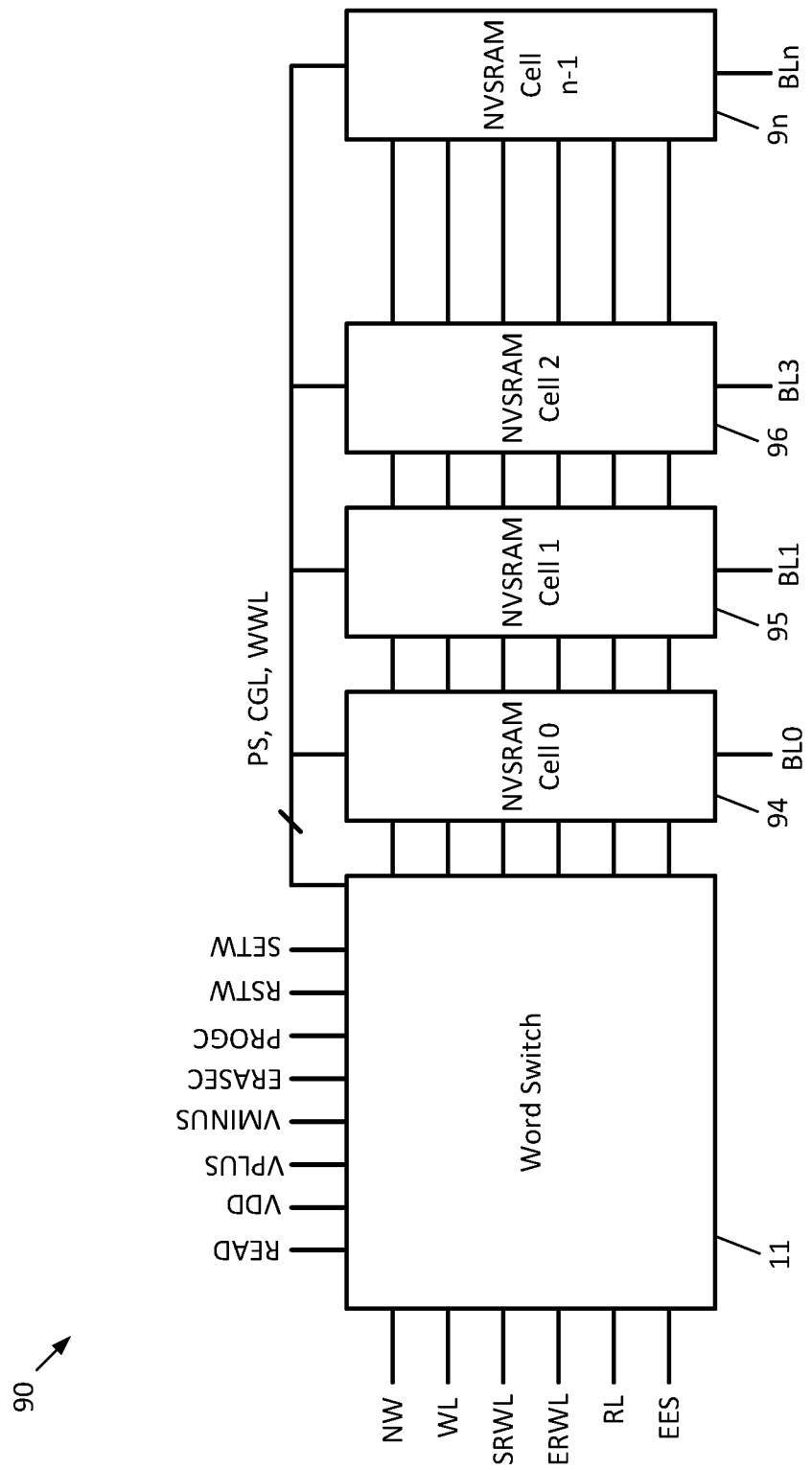
FIG. 2C is a block diagram of a word of an NVSRAM array formed using the word switch circuitry and NVSRAM cells disclosed herein.

An example word 90 utilizing the NVSRAM cells 10 taught above is now described with reference to FIG. 2C. Word switch circuitry 11 has inputs coupled to the NW, WL, SRWL, ERWL, RL, EES, VDD, VPLUS, VMINUS, ERASEC, PROGC, RSTW, READ, and SETW lines, and provides output to the PS, CGL, and WWL lines. Any number of NVSRAM cells 94 . . . 9n are coupled to the word switch circuitry 11 and to their respective bitlines BL0 . . . BLn. The word switch circuitry 11 performs the functions as will be described below so as to facilitate read, write, reload, and store operations performed on and by the NVSRAM cells 94 . . . 9n on a word by word basis.

Figure 2D:
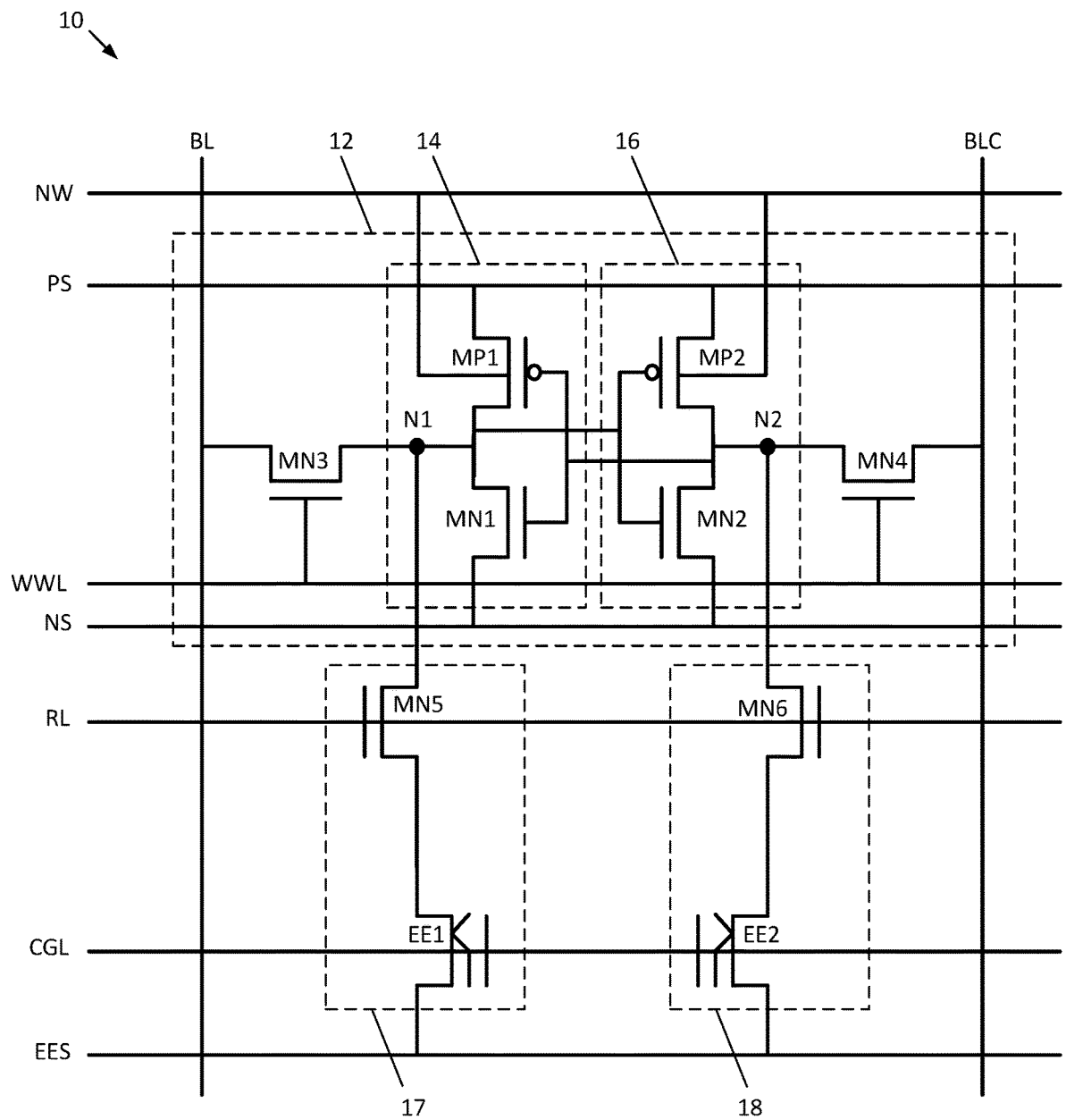
FIG. 2D is a schematic diagram of a NVSRAM cell disclosed herein.

Additional reference now is made FIG. 2D showing the design of the NVSRAM cells 10. The NVSRAM cells 10 are 10T (ten transistor). Each NVSRAM cell 10 includes a 6T (six transistor) SRAM cell 12 formed from first and second cross coupled inverters 14 and 16 forming a latch that stores a data bit, with pass gate transistors MN3 and MN4 providing access to the stored data bit. First and second EEPROM strings 17 and 18 serve to back up the stored data bit if power loss is anticipated or expected, and then the data bit can be retrieved once power is restored.

The first inverter 14 is formed from PMOS transistor MP1 and NMOS transistor MN1. Transistor MP1 has its source coupled to the power supply line PS and its body coupled to the n-well line NW. Transistor MN1 has its drain coupled to the drain of transistor MP1, its source coupled to the NS line, and its gate coupled to the gate of transistor MP1.

The second inverter 16 is formed from PMOS transistor MP2 and NMOS transistor MN2. Transistor MP2 has its source coupled to the power supply line PS and its body coupled to the n-well line NW. Transistor MN2 has its drain coupled to the drain of transistor MP2, its source coupled to the NS line, and its gate coupled to the gate of transistor MP2. The gates of transistors MP2 and MN2 are coupled to the drains of transistors MP1 and MN1, and the gates of transistors MP1 and MN1 are coupled to the drains of transistors MP2 and MN2.

Pass gate NMOS transistor MN3 has its drain coupled to node N1 (at the drains of transistors MP1 and MN1), its source coupled to the bit line BL, and its gate coupled to the word level word line WWL. Pass gate NMOS transistor MN4 has its drain coupled to node N2 (at the drains of transistors MP2 and MN2), its source coupled to the complementary bit line BLC, and its gate coupled to word line WL.

The first EEPROM string 17 is comprised of NMOS transistor MN5 in series with floating gate transistor EE1. The transistor MN5 has its drain coupled to node N1 and a gate coupled to the reload line RL. The floating gate transistor EE1 has its drain coupled to the source of transistor MN5, its source coupled to the EEPROM source line EES, and its gate coupled to the control gate line CGL.

The second EEPROM string 18 is comprised of NMOS transistor MN6 in series with floating gate transistor EE2. The transistor MN6 has its drain coupled to node N2 and its gate coupled to the reload line RL, and a source. The floating gate transistor EE2 has its drain coupled to the source of transistor MN6 and its source coupled to the EEPROM source line EES.

Operation of this circuit for operations on the SRAM cell 12 need not be described herein as it proceeds as is standard for SRAM cells. Operations performed on the EEPROM strings 17 and 18 for storing non-volatile data are now described.

The storing of non-volatile data into the EEPROM cells (floating gate transistors EE1 and EE2) is accomplished by performing an erase operation followed by a program operation.

The erase operation operates as follows. The EES, NS, WWL and RL lines are set to a logic low, isolating the floating gate transistors EE1 and EE2 from the SRAM 12. The n-well line NW and power supply line PS are set to VDD. The CGL line is then pulsed with a high voltage, for example 14V, erasing the contents of the floating gate transistors EE1 and EE2, putting them into an off state.

The program operation operates as follows. The EES, NS, WL, and RL lines are set to a logic low, while the n-well line NW is set to VDD and the power supply line PS is set to 5V. The CGL line is pulsed with −9V so that a cell storing a one sees 5-(−9)=14V and a cell storing a zero sees 0-(−9)=9V, while the RL line is then set to a logic high to connect the floating gate transistors EE1 and EE2 to the SRAM 12. The inverter 14 or 16 that is holding a logic high passes the logic high to the floating gate transistor EE1 or EE2 connected thereto, and the inverter 14 or 16 that is holding a logic zero passes the logic low to the floating gate transistor EE1 or EE2 connected thereto. While a 14V difference between N1 or N2 and CGL is sufficient to program an EEPROM cell, 9V has a negligible effect and is insufficient to program an EEPROM cell. Therefore, the floating gate transistor EE1 or EE2 receiving a logic one is programmed, while the floating gate transistor EE1 or EE2 receiving a logic zero is not programmed. Thus, the data from the SRAM cell 12 is stored as non-volatile data.

The reloading of non-volatile data into the SRAM cell 12 upon power-up is as follows. The EEPROM source line EES and NS line are placed at a logic low, as is the word line WL. The CGL line is placed at a reference voltage Vref, typically around 0.5V to 1V. The n-well line NW and RL line are placed at VDD. The power supply line PS then ramps up. The RL line being at VDD turns on transistors MN5 and MN6, coupling the EEPROM cells (floating gate transistors EE1 and EE2) to nodes N1 and N2. The floating gate transistors EE1 and EE2 will be at different states, with one being "programmed" and containing the bit of stored data and the other being "erased". The floating gate transistor EE1 or EE2 that is programmed will draw more current than the one that is erased, which unbalances the cross coupled inverters 14 and 16, resulting in a flipping of the states of the inverters 14 and 16 to match that of the floating gate transistors EE1 and EE2, thereby reloading the SRAM cell 12 with the stored non-volatile data bit.

Understand that in prior art applications, the PS, CGL, and WL lines are global to a NVSRAM array, such that when a program operation is performed, it is performed globally to all NVSRAM cells of that NVSRAM array. The word level switches 11 disclosed herein permit store operations (non-volatile write operations) to be performed on the NVSRAM array 99 on a word by word basis, such that the granularity of a store operation is one word 90. Keeping this functionality in mind, new or updated opcodes have been devised which combine the operation of a write to the SRAM cells 12 of a word of NVSRAM cells 10 with a store operation of the data from those SRAM cells 12 (once written) to the EEPROM cells 17-18 of those NVSRAM cells 10.

As will be described, the word level switches 11 include a control gate latch 30 which provides the control gate signal to the control gate line CGL, The control gate latch 30 is now described with reference to FIG. 2E. The control gate latch 30 includes cross coupled inverters 32 and 34. The inverter 32 includes PMOS transistor MP31 and NMOS transistor MN31. The transistor MP31 has its source and body coupled to the VPLUS line and its drain coupled to node N31. The transistor MN31 has its drain coupled to node N31 and its source coupled to the VMINUS line. The gates of transistors MP31 and MN31 are coupled to node N32. The inverter 34 includes PMOS transistor MP32 and NMOS transistor MN32. The transistor MP32 has its source and body coupled to the VPLUS line and its drain coupled to node N32. The transistor MN32 has its drain coupled to node N32 and its source coupled to the VMINUS line. The gates of transistors MP32 and MN32 are coupled to node N31.

NMOS transistor MN33 has its drain coupled to node N31 and its gate coupled to the program line PROGC. NMOS transistor MN34 has its drain coupled to the source of transistor MN33, its source coupled to ground, and its gate coupled to the PSN line. NMOS transistor MN35 has its drain coupled to node N31 and its gate coupled to the erase line ERASEC. NMOS transistor MN36 has its drain coupled to the source of transistor MN35, its source coupled to ground, and its gate coupled to the power supply line PS. NMOS transistor MN37 has its drain coupled to node N32, its source coupled to ground, and its gate coupled to the read line READ. The PROGC and PSN signals being at a logic high, or the ERASEC and PS signals being at a logic high, serves to set the control gate latch 30. The READ signal serves to reset the latch. Note that the control gate line signal CGL is generated at node N32.

The power source latch 40 is now described with reference to FIG. 2F. The power source latch 40 includes cross coupled inverters 42 and 44, as well as an inverter 46 coupled in series with the output of inverter 44. Inverter 42 is comprised of PMOS transistor MP41 and NMOS transistor MN41. The transistor MP41 has its source and body coupled to VDD and its drain coupled to node N41. The transistor MN41 has its drain coupled to node N41 and its source coupled to ground. The gates of transistors MP41 and MN41 are coupled to node N42. The inverter 44 includes PMOS transistor MP42 and NMOS transistor MN42. The transistor MP42 has its source and body coupled to VDD and its drain coupled to node N42. The transistor MN42 has its drain coupled to node N42 and its source coupled to ground. The gates of transistors MP42 and MN42 are coupled to node N41.

NMOS transistor MN43 has its drain coupled to node N42 and its gate coupled to the SETW line. NMOS transistor MN44 has its drain coupled to the source of transistor MN43, its source coupled to ground, and its gate coupled to the word line WL. NMOS transistor MN45 has its drain coupled to node N41, its source coupled to ground, and its gate coupled to the RSTW line. Note that the power supply line PS is produced at node N43 and its inverse PSN is produced at node N42. The RSTW signal being at a logic high sets the latch formed from inverters 42 and 44 (and therefore resets the power source latch 40), while the SETW and WL lines being high resets the latch formed from inverters 42 and 44 (and therefore sets the power source latch).

Inverter 46 is comprised of PMOS transistor MP43 and NMOS transistor MN46. PMOS transistor MP43 has its source and body coupled to VDD and its drain coupled to node N43. NMOS transistor MN46 has its drain coupled to node N43 and its source coupled to ground. The gates of transistors MP43 and MN46 are coupled to node N42.

The control circuitry 150 is now described with reference to FIG. 2G. The control circuitry 150 includes NOR gates 156 and inverter 152. Inverter 152 has an input coupled to the word line WL. NOR gate 156 has inputs coupled to the WRITEN line and to the output of inverter 152. The word level word line WWL signal is produced at the output of NOR gate 156.

Figure 2H:
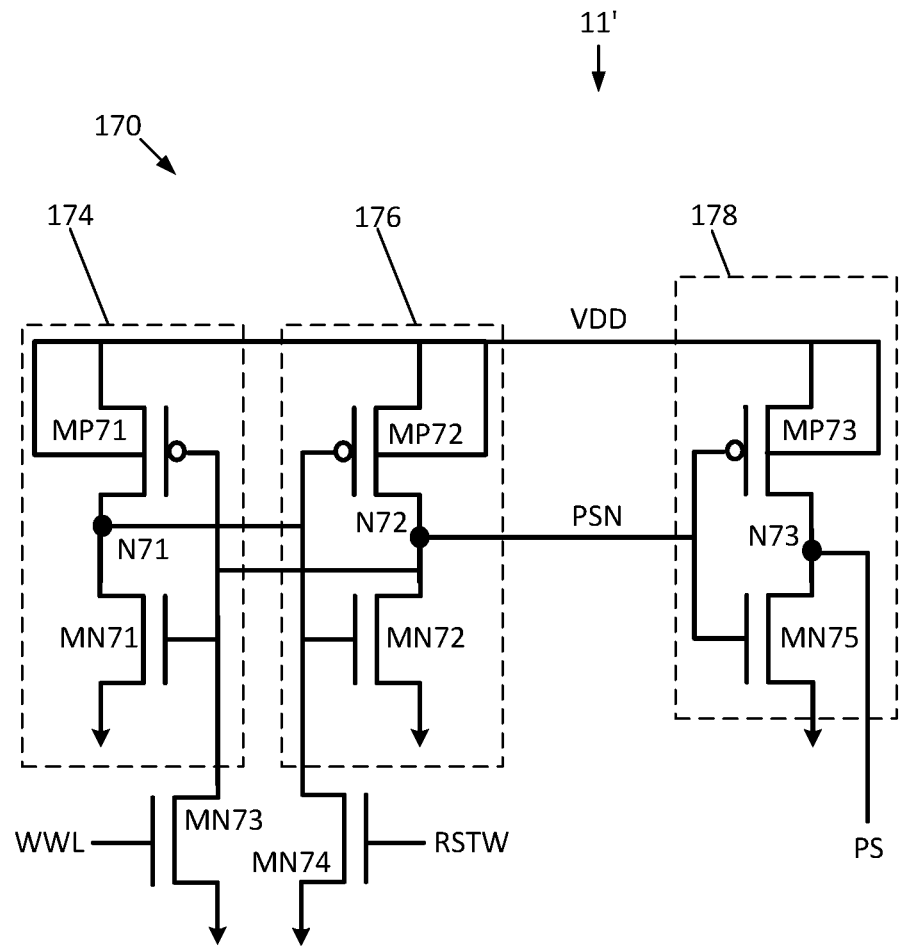
FIG. 2H is a schematic diagram of a design of a power source latch within alternative word switch circuitry for use with the NVSRAM cell of FIG. 2D.
Figure 2I:
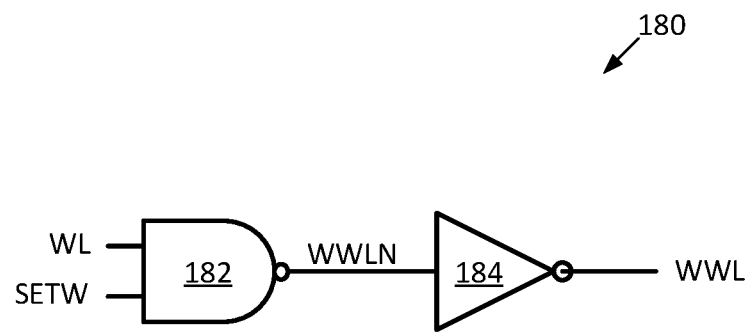
FIG. 2I is a schematic diagram of design of control logic within the alternative word switch circuitry for use with the NVSRAM cell of FIG. 2D.

An alternate design for word switch circuitry 11' is now described with reference to FIGS. 2H-2I. The word switch circuitry 11' is comprised of the control gate latch 30 (FIG. 2E), power source latch 170, and control circuitry 180.

The power source latch 170 includes cross coupled inverters 174 and 176 forming a latch. The inverter 174 includes PMOS transistor MP71 and NMOS transistor MN71. The transistor MP71 has its source and body coupled to VDD and its drain coupled to node N71. The transistor MN71 has its drain coupled to the drain of transistor MP71 and its source coupled to ground. The gates of transistors MP71 and MN71 are coupled to node N72. The inverter 176 includes PMOS transistor MP72 and NMOS transistor MN72. The transistor MP72 has its source and body coupled to VDD and its drain coupled to node N72. The transistor MN72 has its drain coupled to node N72 and its source coupled to ground. The gates of transistors MP72 and MN72 are coupled to node N71. NMOS transistor MN73 has its drain coupled to node N72, its source coupled to ground, and its gate coupled to the word level word line WWL. NMOS transistor MN74 has its drain coupled to node N71, its source coupled to ground, and its gate coupled to the RSTW line. The word level word line WWL being at a logic high resets the latch formed from inverters 174 and 176 and thus sets the power source latch 170, while RSTW being at a logic high sets the latch formed from inverters 174 and 176 and thus resets the power source latch 170. Note that the inverse of the power source signal PSN is produced at node N72.

The power source latch 170 circuitry also includes inverter 178 having its input coupled to node N72 to thereby produce the power source signal PS at its output. Inverter 178 includes PMOS transistor MP73 and NMOS transistor MN75. Transistor MP73 has its source and body coupled to VDD and its gate coupled to node N72. Transistor MN75 has its source coupled to ground, and its gate coupled to node N72. The drains of transistors MP73 and MN75 are coupled to node N73. Note that the power source signal PS is produced at node N73.

The control circuitry 180 includes NAND gate 182 and inverter 184. The NAND gate 182 has inputs coupled to the word line WL and the SETW line, and provides its output to inverter 184. A WWLN signal is produced at the output of the NAND gate 182, and the WWL signal is produced at the output of the inverter 184.

Figure 3:
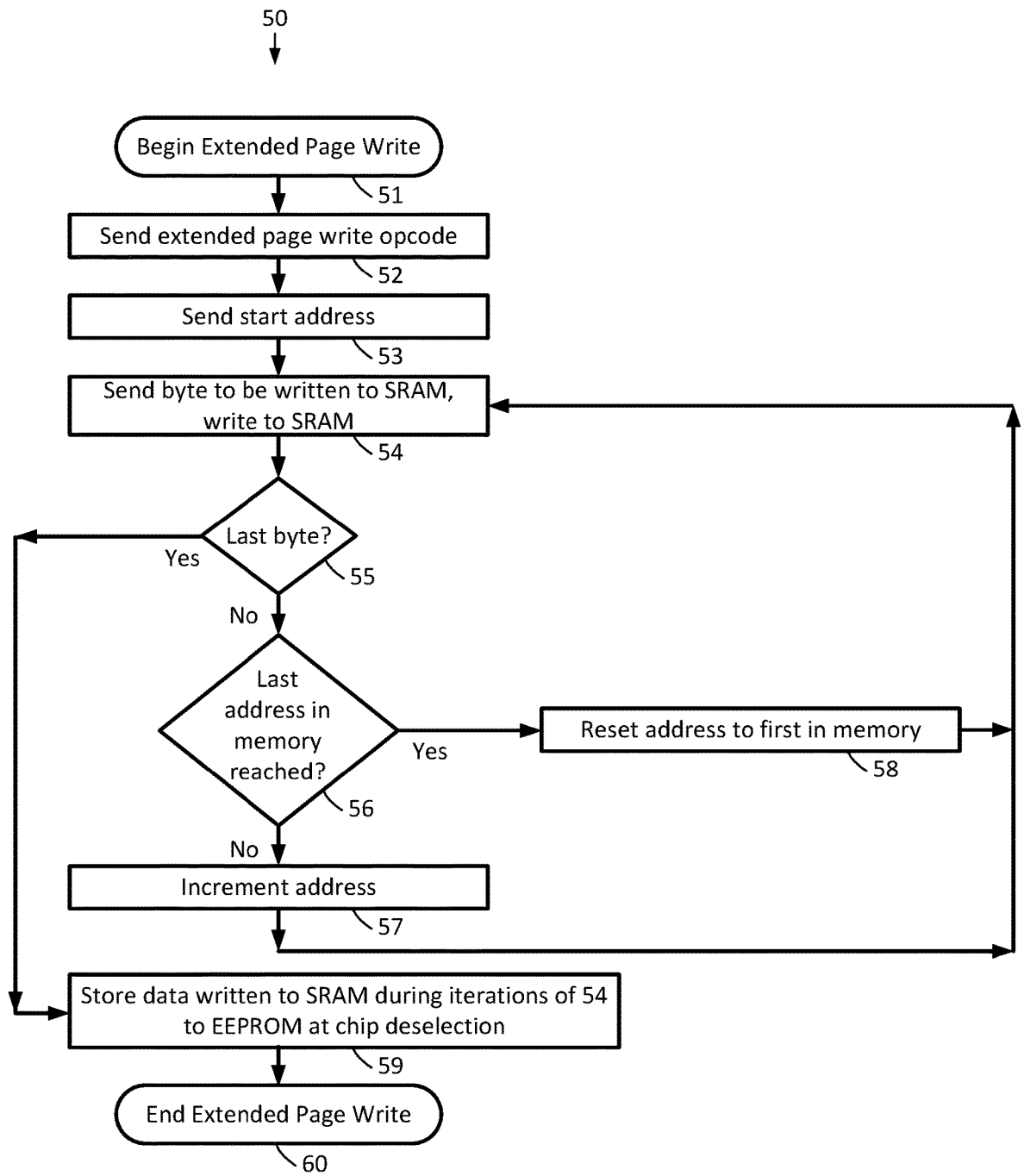
FIG. 3 is a flowchart of a method of performing an extended page write operation on the NVSRAM memory of FIG. 2B.

An extended page write opcode or operation is now described with additional reference to flowchart 50 of FIG. 3. The extended page write operation is characterized by its ability to write to any size memory page, up to and including a page the size of the entire NVSRAM array 99.

The extended page write operation begins at Block 51 by sending an extended page write opcode to the control logic 116, or by sending of signals generated by an external device (such as a microprocessor) based upon the extended page write opcode to the control logic 116 (Block 52). The opcode is sent together with a starting address (Block 53), which is a given number of bytes in length. As an example, for a NVSRAM memory 104 comprised of a 512 k NVSRAM array 99, the starting address would be two bytes, meaning that there would be 16 address bits. The opcode is also sent with, following the starting address, data bytes to be written (Block 54). The control logic 116 operates the NVSRAM cells 10 and their word level switch 11 corresponding to the starting address to write a number of data bytes corresponding to the word length to the SRAM cells 12 of the word 90 at that address (Block 54).

If the last data byte written at the received address is the last data byte sent with the extended page write opcode (Block 55), then at the next chip deselection, the data that was written into the SRAM cells 12 of the NVSRAM words 90 that were addressed during execution of the extended page write opcode are stored into the EEPROM cells of those NVSRAM words 90 (Block 59), and execution of the extended page write opcode is completed (Block 60). If the last data byte written to the addressed NVSRAM word 90 was not the last data byte sent (Block 55), and if the address that data byte was written to is not the last address in the NVSRAM array 99 (Block 56), then the address is incremented by one (Block 57), and the control logic 116 sends the next received data byte to be written to the next addressed NVSRAM word 90 (back to Block 54), and this repetition of Blocks 54, 55, 56, and 57 proceeds until the last byte sent with the opcode has been written. At this point, at the next chip deselection, the data that was written into the SRAM cells 12 of the NVSRAM words 90 that were addressed during execution of the extended page write opcode are stored into the EEPROM cells of those NVSRAM words 90 (Block 59), and execution of the extended page write opcode is completed (Block 60). Note that if at any point, if the address the most recent byte was written into is the last address in the memory (Block 56), and further bytes remain to be written, then the address is reset to the first address in the memory (Block 58), and Block 54 is returned to, with operation proceeding accordingly from there.

Figure 4:
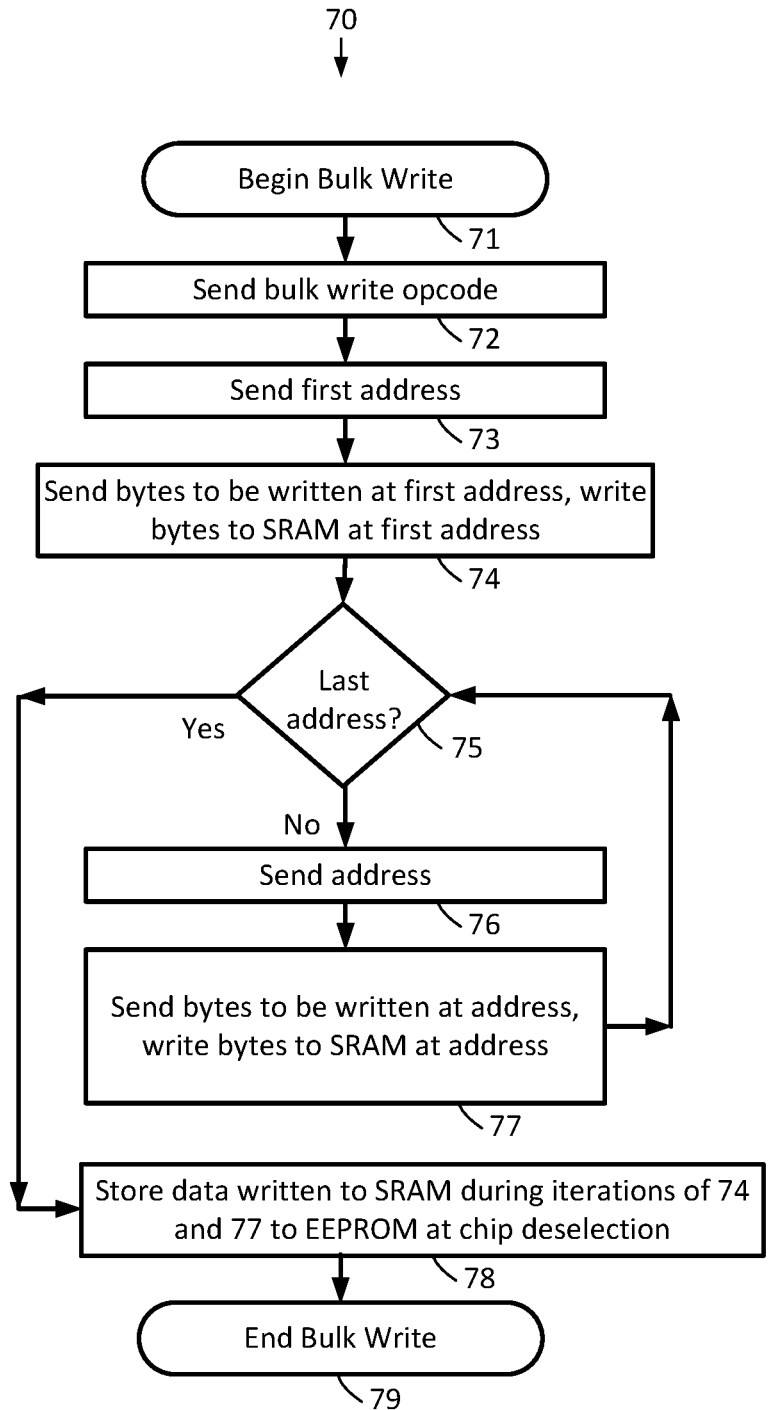
FIG. 4 is a flowchart of a method of performing a bulk write operation on the NVSRAM memory of FIG. 2B.

A bulk write opcode or operation is now described with additional reference to flowchart 70 of FIG. 4. The bulk write operation is characterized by its ability to write to non-sequential addresses.

The bulk write operation begins at Block 71 by sending a bulk write opcode to the control logic 116, or by sending of signals generated by an external device (such as a microprocessor) based upon the bulk write opcode to the control logic 116 (Block 72). The opcode is sent together with a first address (Block 73), which is a given number of bytes in length. The opcode is also sent with, following the first address, data bytes to be written to the word 90 at that first address (Block 74). The control logic 116 operates the NVSRAM cells 10 and their word level switch 11 corresponding to the starting first to write the received data bytes to the SRAM cells 12 at the starting address (Block 74).

If the address just written to was the last address sent (Block 75), then at the next chip deselection, the data that was written into the SRAM cells 12 of the NVSRAM words 90 that were addressed during execution of the bulk write opcode are stored into the EEPROM cells of those NVSRAM words 90 (Block 78), and execution of the extended page write opcode is completed (Block 79)

If the address just written to was not the last address sent with the opcode, then the bulk write operation proceeds to send a next address (Block 76), and then send the bytes intended for that address and writes the bytes to the SRAM cells 12 of the NVSRAM word 90 at that address (Block 77). Note again that this address at Block 76 need not be sequential with the first address (or preceding address), and indeed, may be any address of the NVSRAM array 99. Then, Block 75 is returned to in order to determine whether the address just written to was the last address sent with the opcode. If the address written to was the last address sent with the bulk write opcode, then at the next chip deselection, the data that was written into the SRAM cells 12 of the NVSRAM words 90 that were addressed during execution of the bulk write opcode are stored into the EEPROM cells of those NVSRAM words 90 (Block 78), and execution of the extended page write opcode is completed (Block 79).

Figure 5:
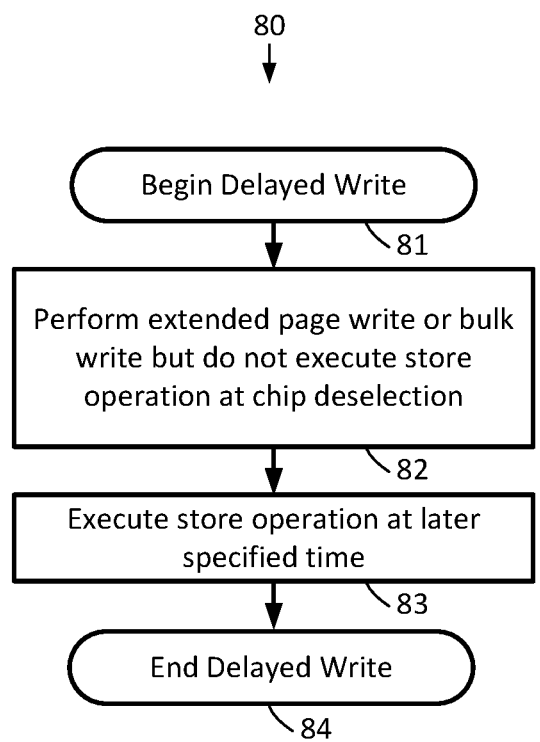
FIG. 5 is a flowchart of a method of performing a delayed write operation on the NVSRAM memory of FIG. 2B.

A delayed write opcode is now described with additional reference to flowchart 80 of FIG. 5. The delayed write operation begins at Block 81 by sending a delayed write opcode to the control logic 116, or by sending of control signals generated by an external device (such as a microprocessor) based upon the delayed write opcode to the control logic 116. Then, an extended page write operation or a bulk write operation is executed (Block 82), however the final store operation that stores the data that was written to the SRAM cells 12 of the NVSRAM words 90 that were addressed during execution of the extended page write or bulk write is not performed at chip deselection. Instead, the final store operation is performed at a later specified time (Block 83), which may be, for example, immediately following the write to SRAM instead of waiting for chip deselection, or at any other desired time.

Understand that for full backward compatibility, the control logic 116 or external device sending control signals to the control logic 116 is also fully capable of executing the traditional, prior art NVSRAM operations of read, write, load, and store. Note that when a traditional prior art NVSRAM write operation is performed, the contents of all SRAM cells in the entire NVSRAM array are stored in their respective EEPROM cells upon chip deselection; with the extended page write and bulk write operations disclosed herein, only those SRAM cells that were actually written to by the command have their contents stored in their respective EEPROM cells upon chip deselection. Also, with the delayed write operations disclosed herein, only those SRAM cells that were actually written to by the command or opcode have their contents stored in their respective EEPROM cells at the later specified time. This helps increase longevity and robustness of the NVSRAM memory 104, as unselected NVSRAM cells 10 and words 90 are not stressed.

Also note that through the use of the word level switches 11 enabling individual word level access, traditional EEPROM store and load operations may be executed if desired. A traditional EEPROM store is a particular case of bulk page write executed by not incrementing the row address when the address to be written reaches the end of the row (corresponding to the first address sent), and instead having the address roll over to the beginning of the row.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of performing a non-volatile write to a memory containing a plurality of non-volatile static random access memory (NVSRAM) cells grouped into words and addressable on a word-by-word basis, with each NVSRAM memory cell including a volatile memory cell and at least one non-volatile memory cell associated therewith, the method comprising steps of:
   a) receiving a non-volatile write instruction, the non-volatile write instruction including at least one address and at least one data word to be written to the NVSRAM cells at that at least one address;
   in response to receipt of the non-volatile write instruction:
   b) writing the at least one data word to the volatile memory cells of the NVSRAM cells at the at least one address included within the non-volatile write instruction; and
   c) at specified time, writing the at least one data word from the volatile memory cells of the NVSRAM cells at the least one address written to during step b) to the non-volatile memory cells associated to those volatile memory cells, but not writing data from other volatile memory cells of other NVSRAM cells to their associated non-volatile memory cells because those NVSRAM cells are not at the at least one address included within the non-volatile write instruction.

2. The method of claim 1, wherein the specified time is when chip deselection of the memory occurs.

3. The method of claim 1, wherein the at least one address comprises a starting address; wherein the at least one data word comprises a plurality of data words; and wherein step b) includes:
   b1) writing a first data word of the plurality of data words to the volatile memory cells of the NVSRAM cells of the word at the starting address;
   b2) incrementing the starting address to produce a next address;
   b3) writing a next data word of the plurality of data words to the volatile memory cells of the NVSRAM cells of the word at the next address;
   b4) if the plurality of data words contains another data word that was not yet written, increment the next address and returning to step b3); and
   b5) if the plurality of data words does not contain another data word that was not yet written, proceeding to step c).

4. The method of claim 3, wherein the specified time is when chip deselection of the memory occurs.

5. The method of claim 3, wherein the specified time is not when chip deselection of the memory occurs.

6. The method of claim 1, wherein the at least one address comprises a plurality of addresses; wherein the at least one data word comprises a plurality of data words; and wherein step b) includes:
   b1) writing a first data word of the plurality of data words to the volatile memory cells of the NVSRAM cells of a word at a first of the plurality of addresses;
   b2) writing a next data word of the plurality of data words to the volatile memory cells of a word of the NVSRAM cells of at a next of the plurality of addresses;
   b3) if the next of the plurality of addresses is a last address of the plurality of addresses, proceeding to step c); and
   b4) if the next of the plurality of addresses is not a last address of the plurality of addresses, returning to step b2).

7. The method of claim 6, wherein the specified time is when chip deselection of the memory occurs.

8. The method of claim 6, wherein the specified time is not when chip deselection of the memory occurs.

9. An electronic device, comprising:
   a memory array comprising a plurality of non-volatile static random access memory (NVSRAM) cells grouped into words and addressable on a word-by-word basis, with each NVSRAM memory cell including a volatile memory cell and at least one non-volatile memory cell associated therewith;
   a plurality of word level switches, each word level switch being associated with one word and permitting writing of data to the non-volatile memory cells of the NVSRAM cells of that word;
   control circuitry configured to perform steps of:
      a) receiving a non-volatile write instruction, the non-volatile write instruction including at least one address and at least one data word to be written to the NVSRAM cells at that at least one address;
      in response to receipt of the non-volatile write instruction:
      b) writing the at least one data word to the volatile memory cells of the NVSRAM cells a word at the at least one address included within the non-volatile write instruction; and
      c) at specified time, writing the at least one data word from the volatile memory cells of the NVSRAM cells at the at least one address written to during step b) to the non-volatile memory cells associated to those volatile memory cells, but not writing data from other volatile memory cells of other NVSRAM cells to their associated non-volatile memory cells because those NVSRANM cells are not at the at least one address included within the non-volatile write instruction.

10. The electronic device of claim 9, wherein the specified time is when chip deselection of the memory array occurs.

11. The electronic device of claim 9, wherein the specified time is not when chip deselection of the memory array occurs.

12. The electronic device of claim 9, wherein the at least one address comprises a plurality of addresses; wherein the at least one data word comprises a plurality of data words; and wherein step b) includes:
   b1) writing a first data word of the plurality of data words to the volatile memory cells of the NVSRAM cells of a word at a first of the plurality of addresses;
   b2) writing a next data word of the plurality of data words to the volatile memory cells of the NVSRAM cells of a word at a next of the plurality of addresses;

b3) if the next of the plurality of addresses is a last address of the plurality of addresses, proceeding to step c); and b4) if the next of the plurality of addresses is not a last address of the plurality of addresses, returning to step b2).

13. The electronic device of claim 12, wherein the specified time is when chip deselection of the memory array occurs.

14. The electronic device of claim 12, wherein the specified time is not when chip deselection of the memory array occurs.

15. A method of operating a non-volatile static random access memory (NVSRAM) addressable on a word-by-word basis, comprising:

a) receiving a non-volatile write instruction, the non-volatile write instruction including at least one address and at least one data word to be written to NVSRAM cells at that at least one address;

b) writing the at least one data word to volatile memory cells of the NVSRAM cells of a word at the at least one address; and c) writing data from the volatile memory cells of the NVSRAM cells written to during step b) to the non-volatile memory cells associated to those volatile memory cells by individually addressing those non-volatile memory cells for non-volatile writing but not writing data from other volatile memory cells of other NVSRAM cells to their associated non-volatile memory cells because those NVSRAM cells are not at the at least one address included within the non-volatile write instruction.

16. The method of claim 15, wherein the at least one address comprises a starting address; wherein the at least one data word comprises a plurality of data words; and wherein step b) includes:

b1) writing a first data word of the plurality of data words to the volatile memory cells of the NVSRAM cells of the word at the starting address;

b2) incrementing the starting address to produce a next address;

b3) writing a next data word of the plurality of data words to the volatile memory cells of the NVSRAM cells of the word at the next address;

b4) if the plurality of data words contains another data word that was not yet written, increment the next address and returning to step b3); and b5) if the plurality of data words does not contain another data word that was not yet written, proceeding to step c).

17. The method of claim 15, wherein the at least one address comprises a plurality of addresses; wherein the at least one data word comprises a plurality of data words; and wherein step b) includes:

b1) writing a first data word of the plurality of data words to the volatile memory cells of the NVSRAM cells of a word at a first of the plurality of addresses;

b2) writing a next data word of the plurality of data words to the volatile memory cells of the NVSRAM cells of a word at a next of the plurality of addresses;

b3) if the next of the plurality of addresses is a last address of the plurality of addresses, proceeding to step c); and b4) if the next of the plurality of addresses is not a last address of the plurality of addresses, returning to step b2).

\* \* \* \* \*